United States Patent [19]
Johnson et al.

[11] Patent Number: 5,639,247
[45] Date of Patent: Jun. 17, 1997

[54] CONTACTING SYSTEM FOR ELECTRICAL DEVICES

[75] Inventors: David A. Johnson, Wayzata; Eric V. Kline, Stillwater, both of Minn.

[73] Assignee: JohnsTech International Corporation, Minneapolis, Minn.

[21] Appl. No.: 399,745

[22] Filed: Mar. 7, 1995

Related U.S. Application Data

[63] Continuation-in-part of Ser. No. 240,021, May 9, 1994.
[51] Int. Cl.$^6$ ...................................................... H01R 9/09
[52] U.S. Cl. ................................................................ 439/74
[58] Field of Search .............................. 439/66, 74, 91, 439/75, 246, 248, 252; 29/843

[56] References Cited

U.S. PATENT DOCUMENTS

| | | | |
|---|---|---|---|
| 4,064,623 | 12/1977 | Moore | 439/91 X |
| 4,118,090 | 10/1978 | Del Mei | 339/12 R |
| 4,240,198 | 12/1980 | Alonso | 439/91 OR |
| 4,397,519 | 8/1983 | Cooney | 339/255 R |
| 5,137,456 | 8/1992 | Desai et al. | 439/66 OR |
| 5,385,477 | 1/1995 | Vaynkof et al. | 439/66 OR |

FOREIGN PATENT DOCUMENTS

| | | | |
|---|---|---|---|
| 0245787 | 11/1987 | European Pat. Off. | G01R 1/067 |
| 3136896 | 4/1983 | Germany | G01R 31/02 |
| 2189657 | 4/1986 | United Kingdom | G01R 1/073 |

*Primary Examiner*—Neil Abrams
*Assistant Examiner*—Daniel Wittels
*Attorney, Agent, or Firm*—Nawrocki, Rooney & Sivertson, P.A.

[57] ABSTRACT

A connector for electrically interconnecting a lead of a device to a terminal spaced at a distance from the lead. The apparatus includes a conductive element comprising a first contact, a shoulder, and a second contact. The first contact is attached to the shoulder and extends upward therefrom, and the second contact is attached to the shoulder and extends downward therefrom. The first contact is electrically coupled to the lead of the device when the lead of the device is brought into engagement with the first contact. The second contact is electrically coupled to the terminal. A support member is positioned below the shoulder of the conductive element and a resilient biasing means comprising an elastomeric material is positioned between the shoulder of the conductive element and the support member. The resilient biasing means resiliently biases the conductive element in an original position. When a downward force is applied to the conductive element, however, the resilient biasing means may be overcome thereby allowing the conductive element to move in a downward direction in response to the downward force. The resilient biasing means returns the conductive element to the original position when the downward force is removed.

60 Claims, 8 Drawing Sheets

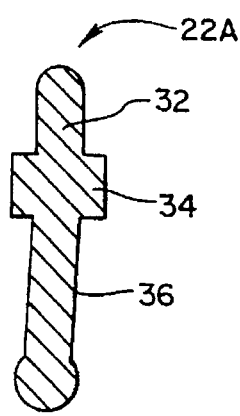
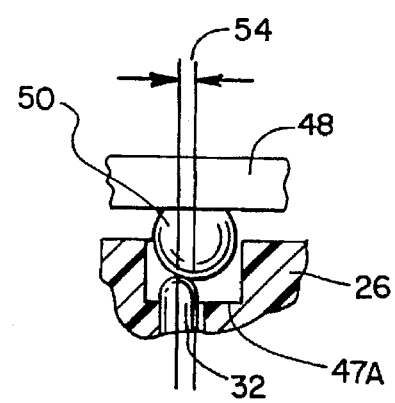
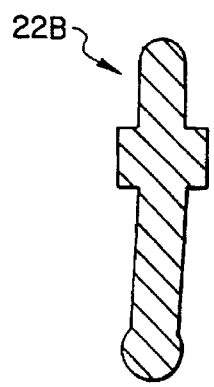
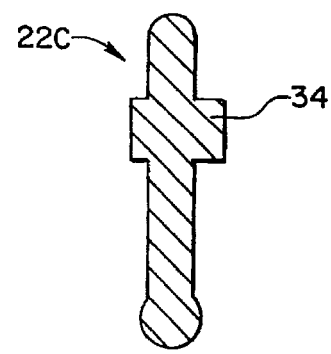
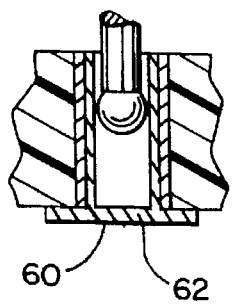
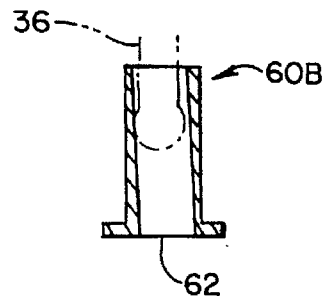
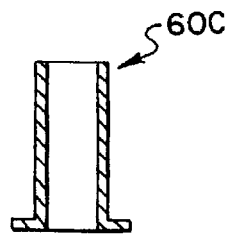

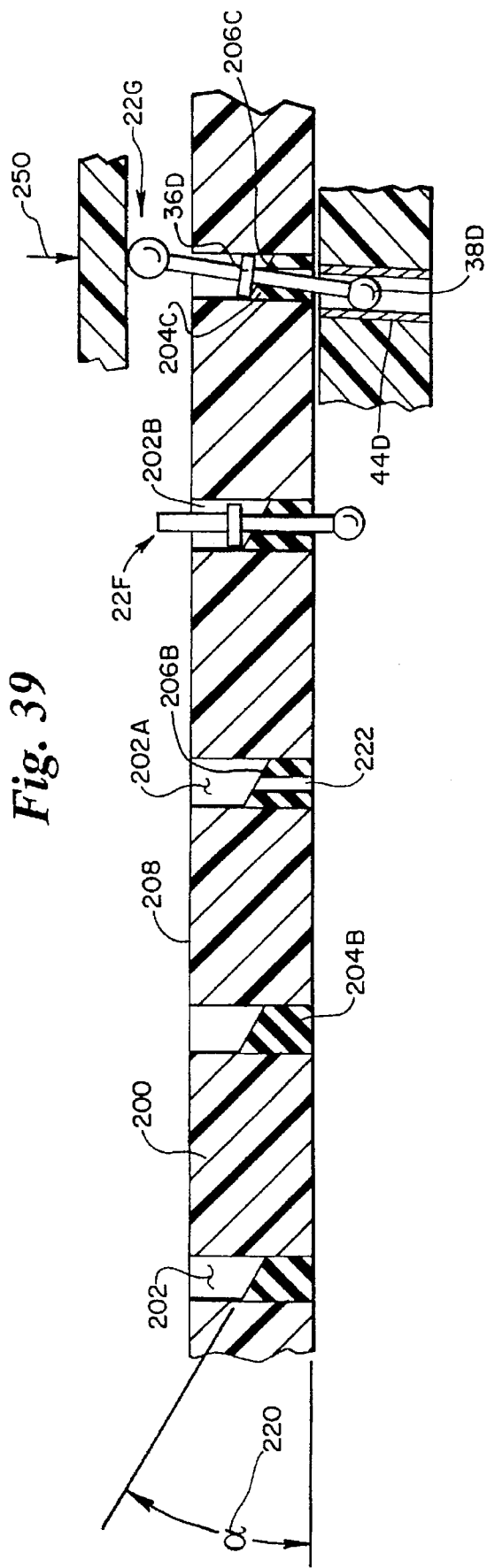

CONTACTING SYSTEM FOR ELECTRICAL DEVICES

REFERENCE TO CO-PENDING APPLICATIONS

The present application is a continuation-in-part of co-pending U.S. patent application Ser. No. 08/240,021, filed May 9, 1994, and entitled "Contacting System for Electrical Devices".

TECHNICAL FIELD

The present invention deals broadly with the field of electrical interconnect systems. More narrowly, however, the invention is related to technology, for example, for interconnecting the leads of an integrated circuit device with corresponding terminals on a printed circuit board interfacing with a tester intended to effect test analysis of the integrated circuit device. The preferred embodiment of the invention is directed to contacts and means for mounting the contacts for effecting such interconnection.

BACKGROUND OF THE INVENTION

A plethora of applications exist for effecting electrical contact between two conductors. One significant application is effecting interconnection between the leads of an integrated circuit device and conductive pads or terminals on a printed circuit board which serves to effect an interfacing between the integrated circuit (IC) device and a tester apparatus. Such apparatus are used to evaluate performance of integrated circuit devices.

Numerous considerations bear upon the structure employed to interconnect the IC and the printed circuit board. These factors include both electrical and mechanical considerations. For typical interconnection systems, special attention must be given to the electrical performance including self inductance and capacitance, the life span requirements, the repairability or replacability, the operation temperature environment, the coplanarity of the device terminals, the mechanical manufacturing limitations, and the device alignment and orientation of the device terminals relative to the interconnection system.

In a typical semi-conductor production facility, each integrated circuit is tested using a tester apparatus. The tester apparatus may be connected to an interconnection system wherein the leads of an integrated circuit are connected to a PC board within the interconnection system. The PC board may then be controlled by the tester apparatus for testing the integrated circuit.

The tester apparatus may test the functionality and performance of an integrated circuit through the interconnection system. Due to manufacturing process variations, a portion of the integrated circuits may perform at a higher level than other integrated circuits. Therefore, the tester apparatus may be used to sort the devices according to their performance characteristics. This is termed "speed grading". Typically, the higher performance integrated circuits will receive a premium price in the market place. It can readily be seen that it is important that the interconnection system not distort the performance characteristics of the integrated circuit under test. If it does, a substantial amount of revenue may be lost by the integrated circuit manufacturer.

A main objective of an interconnection system is to maintain a "non-distorting electrical interconnection" between the tester apparatus and the integrated circuit as discussed above. To accomplish this, it is a goal of an interconnection system to have low lead inductance/resistance, low lead-to-lead capacitance, low lead-to-ground capacitance, and a high electrical decoupling factor. These characteristics all reduce the "distorting" nature of the electrical interconnection system.

Another main objective of the interconnection system is to maintain a consistent and reliable electrical interconnection over many test cycles. In conventional interconnection systems, the contact resistance of the interconnection system may change after continued use. A main cause of this resistance change may be solder buildup on the tips of the contacts within the interconnection system. Increased contact resistance can distort the performance of the integrated circuit and thus reduce the test yield realized.

Because of tolerances in the manufacturing process, all of the leads of a semiconductor package may not be coplanar. For similar reasons, contacts of the interconnection system itself may not be fully coplanar. Therefore, when the integrated circuit and the interconnection system are brought into engagement, some of the leads of the integrated circuit package may not be adequately contacted to corresponding contacts within the interconnection system. It is a goal of the interconnection system to compensate for these non-coplanarities.

To accomplish this, the interconnection system may comprise movable interconnection contact elements such that the first integrated circuit package leads may contact and depress a corresponding contact in the interconnection system until the remaining package leads come into engagement with a corresponding contact. An advantage of this arrangement is that the movable contact elements may allow each semiconductor lead to have a force applied thereon which falls within an acceptable range to establish a gas-tight connection, despite the non-coplanarity of the semiconductor package and interconnection system.

One prior art structure which seeks to accomplish the purpose of the present invention is a pogo-pin configuration. A pogo-pin configuration typically consists of a contact tip, a shaft, a barrel, and a spring. The shaft is enclosed within the barrel and biased by the spring to an upward position. Located at the upper tip of the shaft is the contact tip for contacting the lead of a semiconductor package. The shaft generally makes electrical contact with the barrel, and the lower portion of the barrel is connected to a PC board. As a semiconductor package lead comes into contact with the contact tip, the spring allows the shaft to depress downward into the barrel while still maintaining electrical contact with the barrel. The semiconductor package is forced down on the pogo-pins until all of the semiconductor package leads have an appropriate force thereon.

Although the pogo-pin configuration solves some of the problems discussed above, the leads are generally long and therefore inject a substantial amount of inductance into the interconnection system. Because of this relatively high level of inductance, the pogo-pin configuration may generally be limited to medium to low speed applications.

Another prior art structure which seeks to accomplish the purpose of the present invention is known as the Yamaichi contact. This type of contact includes an inverted L-shaped support having a cantilevered contacting portion mounted at the distal end of the generally horizontal leg of the inverted, L-shaped support, and extending generally parallel to that leg. The distal end of the contacting portion is upwardly turned so that a point thereof is engageable by a lead of an integrated circuit device to be contacted. The support, in turn, is engaged in some manner with or through a pad or terminal portion of a printed circuit board. Problems that have been observed with the Yamaichi contact include solder buildup, difficulty of construction, and high inductance. In addition, the Yamaichi contact relies on the flexure of the contact material.

Another type of structure which seeks to accomplish the purpose of the present invention is a fuzz button contact. A fuzz button contact typically consists of a specially designed array of resilient knitted wire mesh which is retained within a housing that is mounted to a PC board. The lead of a semiconductor package may be received by the housing, wherein the wire mesh forms a connection therewith. The fuzz button contact allows for some degree of compression which helps compensate for the non-coplanarity of the semiconductor package and the interconnection system. Due to the close contact of the wire mesh, a low resistance/ inductance connection can be realized between the PC board and a lead of the semiconductor device. Typical problems which may exist for the fuzz button contact include the loss of compliance of the wire mesh after continued use. Furthermore, the wires within the wire mesh may become fatigued and eventually break. Finally, the wire mesh may become undesirably deformed, particularly if the fuzz button is over compressed. All of these problems limit the reliability and life expectancy of the fuzz button contact configuration.

Another prior art structure which seeks to accomplish the purpose of the present invention is a wire contact. A wire contact consists of a contact wire which is held in place by a housing. A first end of the contact wire is in contact with a PC board. A second end of the contact wire is in contact with a lead of a semiconductor package. As the lead of the semiconductor package is forced down upon the second end of the contact wire, the center portion of the contact wire is bent in a lateral direction. The properties of the contact wire may be selected to provide the desired stiffness and deflection force.

It is to these dictates and shortcomings of the prior art that the present invention is directed. It is an improved electrical interconnecting system which addresses the dictates of the prior art and resolves problems thereof.

SUMMARY OF THE INVENTION

The present invention overcomes the disadvantages found in the prior art by providing an interconnection system having a generally rigid pin assembly which maximizes both the life expectancy and performance characteristics of the interconnection system. This is accomplished by providing a generally rigid contact which may engage a resilient biasing means, wherein the resilient biasing means may provide a bias to the contact. The resilient biasing means resiliently biases the contact in an original position. When a downward force is applied to a first end of the contact, however, the resilient biasing means may be overcome thereby allowing the contact to move in a downward direction in response to the downward force. The resilient biasing means returns the contact to the original position when the downward force is removed. A second end of the contact may be received by a cavity or the like wherein the inner surface of the cavity may comprise a conductive material.

In an exemplary embodiment, the resilient biasing means may comprise an elastomeric element. When exposed to a downward force, the elastomeric element may deform such that the second end of the contact may deflect from an axis which is generally coaxial with the cavity such that the second end of the contact may engage only one side of the inner surface of the cavity. In this way, the second end of the contact may "scrub" or "wipe" the inner surface of cavity as the elastomeric element allows the second end of the contact to move up and down. This scrubbing action may reduce the potential for high contact or inconsistent contact resistance due to possible contamination on the contacting surfaces, thus providing a longer lasting electrical interconnection.

In an illustrative embodiment of the present invention, the assembly may include a housing which is interposed between a lead of an integrated circuit and a corresponding spaced terminal. The housing may have a through-hole through which the first contact element may extend. The upper end of the first contact element may contact a lead of a semiconductor package. A counter-bore hole, which may have a diameter larger than the through-hole, may extend from the back surface of the housing into the housing wall for a predetermined distance. A shoulder may be provided on the first contact element. The shoulder may be received by the counter-bore hole and may have a diameter that is greater than the through-hole. A second contact element may be connected to the shoulder and may extend downward therefrom.

A PC board or the like may be used to connect the second contact element to a tester apparatus. The PC board may have a via therethrough for receiving the lower portion of the second contact element. The via may have a conductive coating placed on an inner surface thereof such that the lower portion of the second contact may electrically contact the inner surface of the via. In one embodiment, the coating on the inner surface of the via may then be electrically connected through a PC trace on the PC board to the tester apparatus. In another embodiment, the conductive coating may comprise a contact receptacle. The contact receptacle may be a conductive tube having an upper portion and a lower portion wherein the lower portion may be domed shaped and may extend downward beyond a lower surface of the PC board. The upper portion of the conductive tube may be received by the via of the PC board, and may receive the lower portion of the second contacting element. The lower "domed shaped" portion of the conductive tube may be surface mounted to a DUT board, a load board, or any other PC type board by solder reflow or other suitable means. It is recognized that the "dome shape" of the lower portion of the conductive tube is only exemplary and that other shapes are contemplated.

In one embodiment of the present invention, the counter-bore hole may be deep enough to receive only the shoulder. In this embodiment, a sheet of an elastomeric material may be placed between the housing and the PC board. The sheet of elastomeric material may have holes therein for allowing the second contact element of each contact assembly to pass therethrough and contact the inner surface of a corresponding via in the PC board.

In another embodiment of the present invention, the via in the PC board may have a diameter that is less than the diameter of the counter-bore hole and shoulder. In addition, the counter-bore hole may be deep enough to receive both the shoulder and an elastomeric element. The elastomeric element, or sleeve, may be disposed between the shoulder and the upper surface of the PC board. The elastomeric element may have a hole therein for receiving the second contact element.

Force applied to the first contact element by the lead of a semiconductor package may be transmitted to the shoulder. The shoulder may transmit the force to the elastomeric material wherein the elastomeric material may be deformed. This may allow the first contact element, the shoulder, and the second contact element to move toward the PC board. The elastomeric material may be selected for a wide variety of depression force characteristics.

In one embodiment of the present invention, the second contact element may contact the entire circumference of the inner surface of the via. However, a preferred mode of the present invention is to have the second contact element only contact one side of the inner surface of the via. As stated above, this may allow the second contact element to "scrub" or "wipe" the inner surface of the via as the elastomeric element allows the contact assembly to move up and down. This scrubbing action may reduce the potential for high contact or inconsistent contact resistance due to possible contamination on the contacting surfaces, thus providing a longer lasting electrical interconnection.

A number of embodiments are contemplated for providing the necessary bias to the contact to help ensure that the second contact element only contacts one side of the inner surface of the via or the contact receptacle. In a first embodiment, an offset may be provided between the elastomeric element and the shoulder. The elastomeric element may be offset in one direction only, radially from a point on the housing, or randomly. The offset may allow a first side of the shoulder to engage more elastomeric material than a second side of the shoulder. In this configuration, force applied to the first contact element by a semiconductor package lead or the like may be transmitted to the shoulder, wherein the second side of the shoulder may be depressed further than the first side of the shoulder because it may engage more elastomeric material. This causes the shoulder, and thus the generally rigid contact, to tilt relative to an axis which is generally coaxial with the via in the PC board. This in turn, may cause the second contact element to engage only one side of the via. In accordance with the present invention, individual elastomeric elements may be provided for each contact as described above. A hole provided in each of the elastomeric elements to receive the contact may be offset from the center of the elastomeric element. For best results, the elastomeric element may be dimensioned to be substantially the same size as the shoulder, but offset therefrom.

In a second embodiment, a sheet of elastomer may be provided between the housing and the PC board as described above. Portions of the elastomeric sheet may be selectively removed to reduce the amount of elastomeric material a second side of the shoulder may engage relative to a first side of the shoulder. That is, predetermined portions of the elastomeric material, which would normally engage a second side of the shoulder, may be selectively removed. In this configuration, force applied to the contact may cause the shoulder, and thus the contact, to tilt relative to an axis that is generally coaxial with the PC board via, thereby causing the second contact element to engage only one side of the via.

By selectively removing predetermined portions of the elastomeric material, as described above, the compression characteristics of the elastomeric material, as experienced by the shoulder of the contact, may be altered and controlled. In a specific embodiment of the present invention, a number of spaced elongated shapes may be removed from a predetermined area of the elastomeric element wherein the predetermined area of the elastomeric element may correspond to the second side of the shoulder. In another embodiment, a number of spaced elongated shapes may be removed from a first predetermined area of the elastomeric element wherein the first predetermined area of the elastomeric element may correspond to a first side of the shoulder, and a greater number of spaced elongated shapes may be removed from a second predetermined area of the elastomeric element wherein the second predetermined area of the elastomeric element may correspond to a second side of the shoulder.

Finally, in yet another embodiment, the number of spaced elongated shapes may comprise a number of holes wherein more holes may be provided in a portion of the elastomeric material which corresponds to the second side of the shoulder. It is contemplated that the above referenced selectively removed portions may be removed from either a sheet of elastomer or a number of elastomer elements, as described above.

It is recognized that the size, number, shape, and placement of the selectively removed portions may affect the compression characteristics of the elastomeric element, and thus the biasing force of the second contact element against a side of the via. That is, for a given downward force applied along a Y-axis to the first contact element by a semiconductor lead or the like, the compression characteristics of the elastomeric element may be controlled to provide a controlled contact force along an X-axis between the second contact element and a side of the via.

For the above referenced embodiments, an increase in the force applied along the Y-axis by a semiconductor lead may result in an a corresponding increase in the contact force along the X-axis between the second contact element and a side of the via. It may be desirable to limit the amount of force that may be applied along the X-axis by the second contact element to a side of the via. In a preferred embodiment, the inner surface of the via may comprise aluminum or some other conductive material, and the thickness of the conductive material may be relatively thin. If too much force is applied along the X-axis between the second contact element and the inner surface of the via, the conductive material may become scratched or otherwise damaged. This may cause corrosion or even the removal of the conductive material, thereby reducing the reliability of the contacting system.

To overcome this limitation, it may be advantageous to further control the contact force between the second contact element and a side of the via. In one embodiment, predetermined ones of the selectively removed portions discussed above, may have a bevelled and/or stepped edge therein. That is, when the selectively removed portions are cut away from the elastomeric material, a beveled and/or stepped edge may be provided therein. Although the preferred embodiment provides a beveled and/or stepped edge on the selectively removed portions, it is also contemplated that a beveled and/or stepped edge may be provided on an outer edge of the individual elastomer elements discussed above.

When a bevelled edge is provided, the compressibility of the elastomeric element may vary depending on the force applied by a semiconductor lead along the Y-axis. That is, the contact force which may result along the X-axis between the second contact element and a side of the via may depend on the magnitude of the force applied along the Y-axis to the first contact element. For example, for a relatively small force applied along the Y-axis by a semiconductor lead or the like, the second contact element may deflect a relatively large amount along the X-axis thereby engaging a side of the via. However, as the force applied along the Y-axis increases, the resulting force between the second contact element and a side of the via may not increase by a same amount. By properly designing the bevel, the force applied along the X-axis between the second contact element and a side of the via may be substantially limited, regardless of the force that is applied by a semiconductor lead along the Y-axis.

When a stepped edge is provided, the compressibility of the elastomeric element may also vary depending on the force applied by a semiconductor lead along the Y-axis. In this embodiment, the contact force which may result along the X-axis between the second contact element and a side of the via may depend on whether the magnitude of the force applied along the Y-axis to the first contact element is above or below a "threshold" level. That is, if the force applied by a semiconductor lead along the Y-axis is below the threshold level, the resulting force along the X-axis between the second contact element and a side of the via may be governed by a first width of the elastomeric material which may engage the shoulder. However, if the force applied by a semiconductor lead along the Y-axis is above the threshold level, the resulting force along the X-axis between the second contact element and a side of the via may be governed by a second width of the elastomeric material which may engage the shoulder. By properly designing the stepped edge, the force applied along the X-axis between the second contact element and a side of the via may be substantially limited, regardless of the force that is applied by a semiconductor lead along the Y-axis. It is contemplated that both a beveled and step edge may be provided to yield a hybrid between the above referenced embodiments.

It can readily be seen that the bevelled and/or stepped edges may allow an increasing force on the first contact element to result in an increasing force by the second contact element on a side of the via or contact receptacle. However, as a desired maximum force between the second contact element and a side of the via or contact receptacle is reached, the bevelled and/or stepped edge may reduce or substantially limit the increase in force provided by the second contact element to a side of the via or contact receptacle. This may provide control over the contact force between the second contact element and the via thereby resulting in a longer lasting and more reliable electrical contacting system.

Another embodiment of the present invention comprises a housing having a number of counter bore holes, wherein each of the number of counter bore holes may be filled with a liquid elastomer. After the liquid elastomer has cured, a hole may be created therein such that the hole may receive a contact element. It is also contemplated that a contact element may be placed in a corresponding counter bore hole prior to filling the counter bore hole with the liquid elastomer. In this embodiment, the liquid elastomer may form around the contact element thereby providing a self aligned contact hole. The contact element may have a shoulder wherein the dimensions of the shoulder may be larger than the hole in the elastomeric element such that the shoulder may engage the elastomeric element.

In another embodiment of the present invention, the housing of the previous embodiment may be placed at a predetermined angle before the liquid elastomer is allowed to cure. The housing is maintained at the predetermined angle until the liquid elastomer has cured. Thereafter, a hole may be created in the elastomeric element wherein the hole may receive a contact element. As indicated above, it is contemplated that a contact element may be placed in a corresponding counter bore hole prior to filling the counter bore hole with the liquid elastomer, thereby creating a self aligned contact hole. In this configuration, a top surface of the elastomeric element may be at the predetermined angle relative to the counter bore hole in the housing. As the shoulder of a contact engages the elastomeric element, the contact element may be urged to conform to the predetermined angle, thereby providing a force in the X-direction between a corresponding second contact element and a side of a via or contact receptacle, as described above.

Finally, it is recognized that the present invention may be used with a Pin Grid Array (PGA) package, a Ball Grid Array (BGA) package, a DIP package, or any other type of semiconductor package or circuit-board to circuit interconnection means. In addition, it is recognized that the present invention does not require a PC board. Rather, any means for connecting the pin assembly to a tester apparatus is considered to be within the scope of the present invention.

The present invention is thus an electrical contact interconnecting system improved over systems of the prior art. More specific features and advantages obtained in view of those features will become apparent with reference to the DETAILED DESCRIPTION OF THE INVENTION, appended claims, and accompanying drawing figures.

BRIEF DESCRIPTION OF THE DRAWINGS

FIG. 5 is an enlarged fragmentary sectional view of the embodiment of FIG. 4 showing an enlarged view of the contact between the BGA package and the present invention;

FIG. 6 is a sectional view of a single contact element and a fourth embodiment of the present invention;

FIG. 7 is a sectional view of a single contact element and a fifth embodiment of the present invention;

FIG. 8 is a sectional view of a single contact element and a sixth embodiment of the present invention;

FIG. 9 is a sectional view of a single contact element and a seventh embodiment of the present invention;

FIG. 10 is a sectional view of a via insert and an eighth embodiment of the present invention;

FIG. 11 is a sectional view of a via insert and a ninth embodiment of the present invention;

FIG. 39 is an enlarged fragmentary sectional view of the embodiment shown in FIG. 38 showing a contact element placed therein.

DETAILED DESCRIPTION OF THE INVENTION

Figure 1:
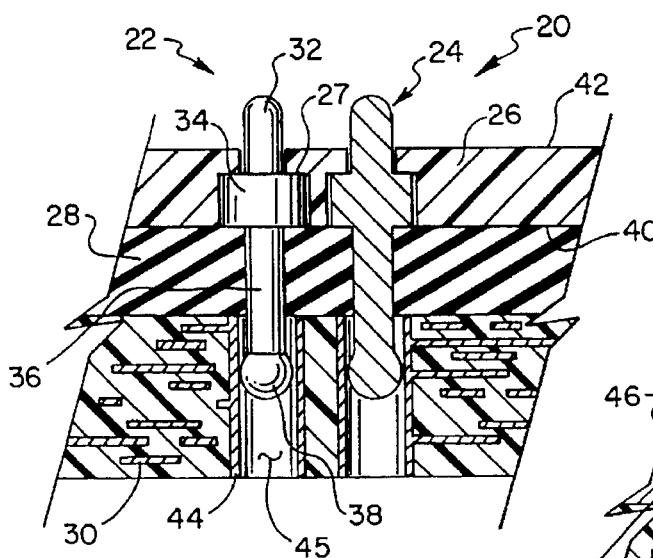
FIG. 1 is an enlarged fragmentary sectional view of a first embodiment of the present invention.

Referring now to the drawings wherein like reference numerals denote like elements throughout the several views, FIG. 1 generally illustrates a contacting system 20 of a first embodiment of the present invention and more specifically shows a first pin assembly 22, a second pin assembly 24, a housing 26, an elastomer sheet 28, and a Printed Circuit (PC) board 30. Although only a first pin assembly 22 and a second pin assembly 24 are shown, the present invention contemplates that any number of pin assemblies may be incorporated into the present invention.

The pin assembly 22 comprises a first contact element 32, a shoulder 34, and a second contact element 36. A lower end of the first contact element 32 is integrally formed with an upper portion of the shoulder 34. An upper end of the second contact element 36 is integrally formed with a lower portion of the shoulder 34. A lower end of the second contact assembly 36 may comprise an enlarged sphere 38. It is recognized that the enlarged sphere 38 may be any shape and is not limited to a spherical shape as shown. It is also recognized that the pin assembly does not have to be what is commonly thought of as a "pin". Rather, the pin assembly may be a conductive element having any shape and still be within the scope of the present invention.

The housing 26, elastomer sheet 28, and PC board 30 have a passthrough hole with a diameter extending therethrough along a common axis such that the pin assembly 22 may be received by the passthrough hole. The housing 26 may have a counter-bore hole 27 with a diameter equal to or larger than the diameter of the passthrough hole wherein the counter-bore hole 27 extends from a lower surface 40 of the housing 26 into the housing for a predetermined distance. The diameter of the counter-bore hole 27 may be large enough to accommodate the shoulder 34 of the pin assembly 22. In this configuration, the shoulder 34 of the pin assembly 22 is secured within the contacting system via the housing 26 on the upper and side surfaces and by the sheet of elastomer on the lower surface. When a force is applied to the pin assembly 22 in a downward direction, the shoulder 34 produces force on the elastomer sheet 28 thereby compressing the elastomer sheet 28. Therefore, the pin assembly 22 is movable in a downward direction in response to a downward force applied to the pin assembly 22.

Figure 2:
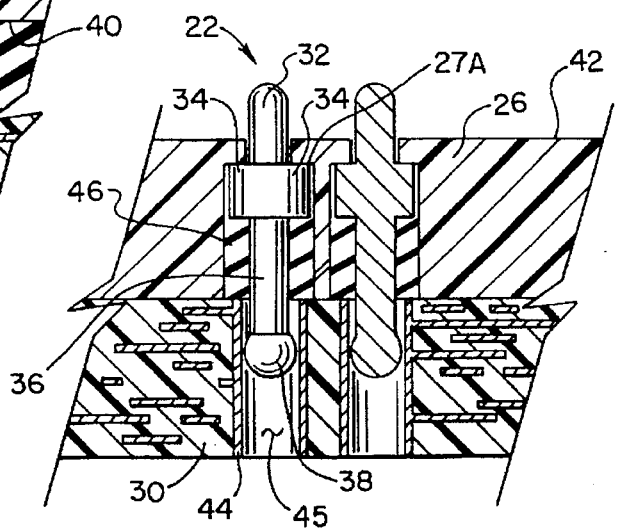
FIG. 2 is an enlarged fragmentary sectional view of a second embodiment of the present invention.

In the embodiments shown in FIGS. 1 and 2, the first contact element 32 extends a predetermined distance above an upper surface 42 of housing 26. In the embodiments shown in FIGS. 1–4, the second contacting element 38 extends through the elastomer and may extend a predetermined distance into the passthrough hole in the PC board 30. The passthrough hole in the PC board 30 is called a via 45. The via 45 has an inner surface which may be coated with a conductive coating 44 such that the enlarged sphere 38 at the lower end of the second contacting element 26 may make an electrical connection therewith. The conductive coating 44 on the inner surface of the via 45 may be electrically coupled to a trace (not shown) on the PC board's 30 surface or coupled to internal traces or power/ground planes layered within the PC board 30. The traces on the PC board 30 may be coupled to a tester (not shown). Connected in this manner, a tester may be coupled to the pin assembly 22.

As stated above, the pin assembly 22, and therefore the enlarged sphere 38, is movable in response to a force applied to the pin assembly 22. Therefore, the enlarged sphere 38 may "scrub" the inner surface 44 of the via 45 in the PC board 30. This scrubbing action helps reduce the potential for high contact or inconsistent contact resistance due to possible contamination on the contacting surfaces, thus providing a longer lasting electrical interconnection.

The elastomer sheet 28 of the embodiment shown in FIG. 1 separates the housing 26 and the PC board 30. In addition, the elastomer sheet 28 may have a plurality of holes therethrough along the axis of the pin assemblies. Although this construction is simple, there may be concerns regarding thermal expansion. Typical temperature requirements for semiconductor devices range from −55 degrees C. to +125 degrees C. To ensure that a semiconductor device meet these requirements with proper design margins, manufacturers may test a semiconductor device from −65 degrees C. to +165 degrees C. Therefore it is recommended that the sheet of elastomer 28 be made of a material that has a coefficient of thermal expansion that is similar to the material used for the housing 26 and the PC board 30. It is further recommended that an embedded fiber be used to help control the thermal expansion rate of the elastomer sheet. It is contemplated that the elastomer sheet is only exemplary and that any resilient biasing means comprising an elastomer material may be used in the present invention.

The embodiment contained in FIG. 2 is similar to the embodiment described above. However, the elastomer sheet 28 is replaced by a cyndrical elastomer portion 46 around each pin assembly 22. In this embodiment, the housing 26, the cyndrical elastomer portion 46, and PC board 30 have a passthrough hole with a diameter extending therethrough along a common axis such that the pin assembly 22 may be received by the passthrough hole. The housing 26 may have a counter-bore hole 27A with a diameter equal to or larger than the diameter of the passthrough hole wherein the counter-bore hole 27A extends from a lower surface 40 of the housing 26 into the housing a predetermined distance. The predetermined distance may be sufficient to accommodate the shoulder 34 and the cyndrical elastomer portion 46. The diameter of the counter-bore hole 27A may be large enough to accommodate the shoulder 34 of the pin assembly 22. The diameter of the cyndrical elastomer portion may be smaller, equal, or greater than the shoulder 34. In this configuration, the shoulder 34 of the pin assembly 22 and the cyndrical elastomer portion 46 are secured within the contacting system via the housing 26 on the upper and side surfaces and by the PC board 30 on the lower surface. When a force is applied to the pin assembly 22 in a downward direction, the shoulder 34 produces a force on the cyndrical elastomer portion 46 thereby compressing the cyndrical elastomer portion 46. Therefore, the pin assembly 22 is movable in response to a force applied to the pin assembly 22. It is contemplated that the cyndrical elastomer portion 46 may be any shape and not limited to only a cyndrical shape. It is also contemplated that the elastomer element is only exemplary and that any resilient biasing means comprising an elastomer material may be used in the present invention.

The embodiment contained in FIG. 2 is not as susceptible to thermal expansion effects as the embodiment contained in FIG. 1. The cyndrical elastomer portion 46 may be made from materials that have a coefficient of thermal expansion that is substantially different than the materials of the housing 26 and the PC board 30. This allows the use of a broader class of materials, such as silicone rubber, in the cyndrical elastomer portion 46.

Figure 3:
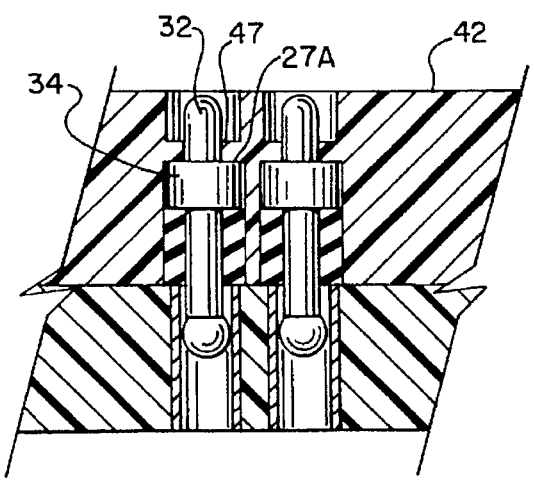
FIG. 3 is an enlarged fragmentary sectional view of a third embodiment of the present invention.

The embodiment contained in FIG. 3 is very similar to the embodiment contained in FIG. 2. The primary difference between these two embodiment is that in FIG. 3 the first contact element 32 does not extend past the upper surface 42 of the housing 26. Rather, a self alignment counterbore hole 47 may be provided from the upper surface 43 of the housing 26 for a predetermined depth. The predetermined depth of the self alignment counterbore hole 47 is set such that the self alignment counterbore hole 47 does not extend all the way to the counterbore hole 27A that receives the shoulder. That is, in the exemplary embodiment, there is a portion of the passthrough hole that remains between the counterbore hole 27A and the self alignment counterbore hole 47.

Figure 4:
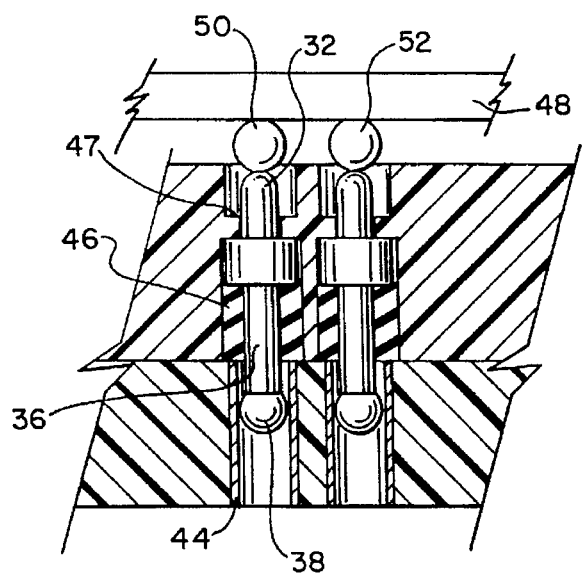
FIG. 4 is an enlarged fragmentary sectional view of the third embodiment of the present invention in contact with a semiconductor device having a ball grid array (BGA) package.

The self alignment counterbore hole 47 may be used to self align a semiconductor package lead with the first contacting element 32. Referring to FIG. 4, a Ball Grid Array (BGA) semiconductor package 48 having a solder ball contact 50 and a solder ball contact 52 may be placed in contact with the first contact element 32. The self alignment counterbore holes provide a mechanism for aligning the solder ball contact 50 with the corresponding first contact element 32. Consistent therewith, the self alignment counterbore hole 47 may have a diameter that is less than, equal to, or greater than the diameter of the solder ball contact 50.

As stated above, it is contemplated that a plurality of pin assembles may be used in the present invention. In addition, it is contemplated that the pin assemblies will be spatially positioned such that the each of the plurality of pin assemblies contact a corresponding solder ball contact 50 of the semiconductor package 48. Finally, it is contemplated that the present invention may work with any type of semiconductor package with any type of lead including the Ball Grid Array (BGA) package having solder ball contact leads and a Pin Grid Array (PGA) package having pin contact leads.

Referring to FIG. 5, the ball contact 50 of the semiconductor package 48 may be offset from the center of the first contact element 32 by an offset distance 54. This configuration provides a lateral force on the first contact element 32. Referring to FIGS. 1–4, the lateral force provided to the first contact element 32 is transmitted through the shoulder 34 and the second contact element 36 and finally to the enlarged sphere 38. Therefore, the enlarged sphere 38 is laterally forced against one side of the inner surface 44 of the via 45.

In a preferred embodiment of the present invention, only one side of the inner surface 44 of the via 45 is contacted by the enlarged sphere 38. This configuration reduces the friction between the inner surface 44 and the enlarged sphere 38 thereby allowing the pin assembly to more easily slide up and down within the via 45. In addition, the scrubbing action along the one side of the inner surface helps reduce the potential for high contact or inconsistent contact resistance due to possible contamination on the contacting surfaces, thus providing a longer lasting electrical interconnection.

In this embodiment, the self alignment counterbore 47A may be offset from the axis of the pin assembly 22 by the offset distance 54. This allows the solder ball contact 50 to be self aligned an offset distance 54 from the axis of the pin assembly 22.

Two other embodiments of the present invention which allow the enlarged sphere to contact one side of inner surface 44 are illustrated in FIGS. 6–7. Referring to FIG. 6, a pin assembly 22A may have the second contact element extending from the shoulder 34 at an angle from the general axis of the pin assembly 22A. This places the enlarged sphere 38 against only one side of inner surface 44 of the via 45. Referring to FIG. 7, the second contact element 36 may have a bend therein such that the enlarged sphere 38 is placed against only one side of inner surface 44 of the via 45. The embodiments contained in FIGS. 6–7 may be used with any of the embodiments shown in FIGS. 1–4. Consistent therewith, the through-hole in the elastomer element may be at an angle from the general axis of the pin assemblies 22A or 22B such that the second contact element 36 may slide more easily therein.

In another embodiment of the present invention, the axis of the shoulder 34 may be offset from the axis of a pin assembly 22C as shown in FIG. 8. In this embodiment of the present invention, the shoulder 34 may extend a first distance from the pin assembly 22C on one side of the pin assemble 22C and a second distance from the pin assembly 22C on the other side of the pin assembly 22C. The first distance may be greater than the second distance. When force is applied to the first contact element 32 by a semiconductor package, more elastomer must be compressed by the side that has a shoulder extending a greater distance out therefrom. This causes the enlarged sphere 38 to be laterally forced against one side of the inner surface 44 of the via 45. The embodiment contained in FIG. 8 may also be used with any of the embodiments shown in FIGS. 1–4.

FIGS. 9 and 11 illustrate another embodiment of the present invention. In FIGS. 9 and 11, the second contact element 36 may be offset from the center axis of the via such that the enlarged sphere 38 touches only one side of the inner surface 44 of the via 45. In addition, there may be a via insert 60 that may be placed within the via 45 as shown. Via inserts 60 and 60C may have a hole therethrough generally concentric with the via 45. Consistent therewith, via inserts 60 and 60C generally have vertical walls that are substantially parallel to the axis of the pin assembly 22. The via insert 60 of FIG. 9 also has a bottom wall 62 enclosing the bottom of via 45. Via inserts 60 and 60C may be integrally formed with the PC board 30.

Another embodiment of the via insert is illustrated in FIG. 10. Referring to FIG. 10, via insert 60B may have a hole 62 therethrough wherein the hole 62 is set at an angle from the axis of the via insert 60B. In this embodiment, the second contact element 36 becomes more intensely engaged with one side of the inner surface of the via insert 60B as the second contact element 36 is depressed in a downward direction. Therefore, the further the second contact element 36 is depressed, the more force exists between the enlarged sphere 38 and the inner surface of the via insert 60B.

Figure 12:
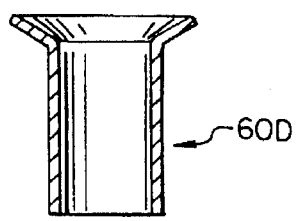
FIG. 12 is a sectional view of a via insert and a tenth embodiment of the present invention.
Figure 13:
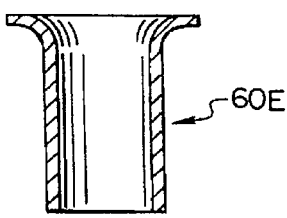
FIG. 13 is a sectional view of a via insert and an eleventh embodiment of the present invention.
Figure 14:
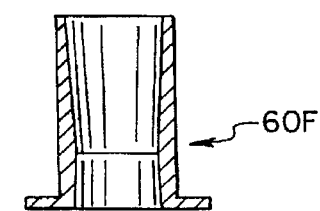
FIG. 14 is a sectional view of a via insert and a twelfth embodiment of the present invention.

FIGS. 12–14 illustrate various other embodiments of the via insert element. FIG. 12 shows a via insert 60D having a flanged top end. This embodiment allows the pin assembly 22 to be more easily inserted into the via insert 60D. Similarly, FIG. 13 shows a via insert 60E having a rolled over top end. This embodiment also allows the pin assembly 22 to be more easily inserted into the via insert 60E. Finally, FIG. 13 shows a via insert 60F having a taped inner surface. The top end of the via insert 60F has a larger opening for guiding the pin assembly 22 into the via insert 60F. The diameter of the opening in the via insert 60F gradually decreases such that at the bottom portion of the via insert 60F the diameter is just slightly larger than the diameter of the enlarged sphere 38.

Figure 15:
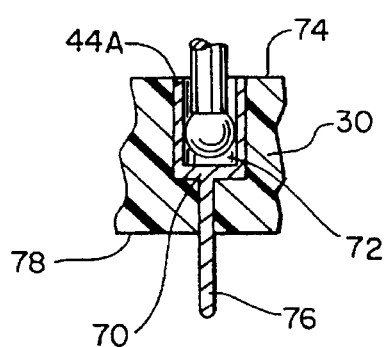
FIG. 15 is a sectional view of a test socket adapter assembly and thirteenth embodiment of the present invention.

Another embodiment of the present invention is shown in FIG. 15. Instead of having a hole extending through the entire PC board 30 for each pin assembly, a test socket adapter assembly 70 is installed in place thereof. The test socket adapter assembly comprises an opening 72 in the top surface 74 of the PC board 30. The opening 72 may have a depth such that the pin assembly 22 may have a full range of movement. However, the opening does not traverse through the entire width of the PC board 30. An inner surface of opening 72 may be coated with a conductive coating 44A and the conducting coating 44A may be coupled to a trace (not shown) on the PC board 30. A conductive element 76 may be coupled to the conductive coating 44A and may travel to the lower surface 78 of the PC board 30. An advantage of having the opening 72 in the PC board 30 rather than the via 45 is that the opening 72 frees up a number of routing layers in the PC board. This allows better decoupling between signals on the PC board and also allows more signals to be routed on the PC board. Another advantage is to allow an adapter board to transition between a P.C. Board 30 and a test socket. The adapter board may allow specific configurations of the high performance test apparatus to be attached to a standard P.C. board.

It is recognized that the present invention does not require a PC board. Rather, any means for connecting the pin assembly to a tester apparatus, such as a terminal, may be used and still be within the scope of the present invention.

Figure 16:
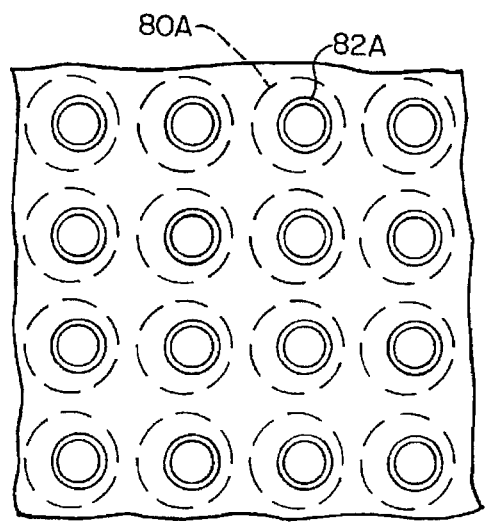
FIG. 16 is a fragmentary bottom plan view of a single bias array of contacts.

FIG. 16 is a fragmentary bottom plan view of an array of contact elements biased in a single direction. Referring to FIG. 5, the semiconductor package may be offset from the first contact element 32 by an offset distance 54. In addition, referring to FIG. 8, the shoulder 34 and the cyndrical elastomer may also be offset by an offset distance. Referring back to FIG. 16, the dashed circles 80A represent an array of cyndrical elastomer elements 46 while the solid concentric circles 82A represent a cross section of an array of the first contact elements 32. As can be seen from FIG. 16, the cyndrical elastomer elements 80A may be offset from the first contact elements 82A in one direction only. That is, each elastomer element may be offset a set direction and distance from its corresponding first contact element.

Figure 17:
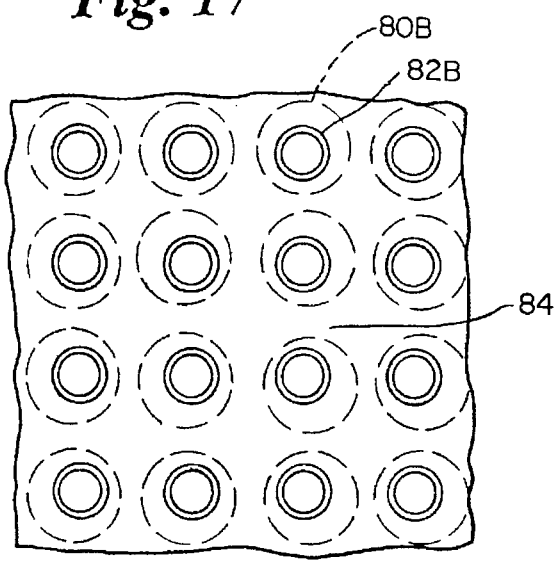
FIG. 17 is a fragmentary bottom plan view of a radial bias array of contacts.

FIG. 17 is a fragmentary bottom plan view of an array of contact elements biased in a radial direction. That is, the cyndrical elastomer elements 80B may be offset from the first contact elements 82B in a radial direction from point 84. That is, each elastomer element may be offset in a radial direction about a point 84 from its corresponding first contact element.

Figure 18:
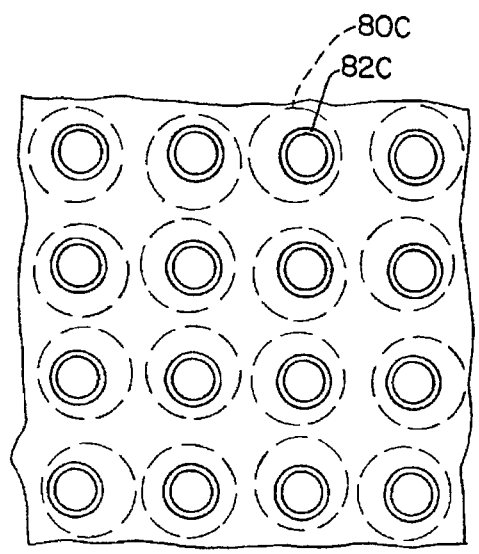
FIG. 18 is a fragmentary bottom plan view of a random bias array of contacts.

FIG. 18 is a fragmentary bottom plan view of an array of contact elements biased in a random direction. That is, the cyndrical elastomer elements 80C may be offset from the first contact elements 82C in a random direction. That is, each elastomer element may be offset in a random direction from its corresponding first contact element.

The above patterns and offset positions are only exemplary. It is recognized that other patterns and offset positions are within the scope of the present invention.

Figure 19:
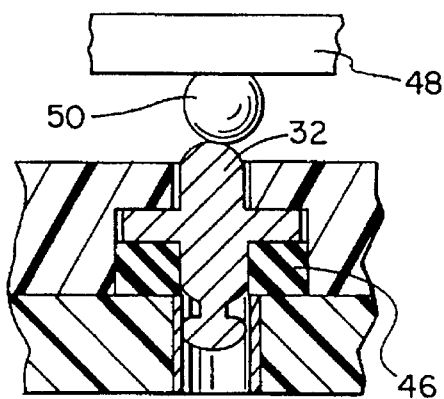
FIG. 19 is a fragmentary section of a fourteenth embodiment of the present invention.

FIG. 19 illustrates the embodiment of FIG. 2 having a Ball Grid Array (BGA) semiconductor package 48. The BGA semiconductor package 48 has at least one solder ball contact element 50. In a preferred mode of the present invention, the top end of the first contact element 32 is domed shaped when used in conjunction with a BGA semiconductor package 48.

Figure 20:
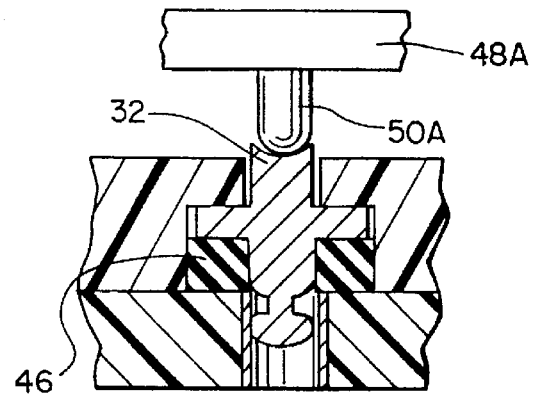
FIG. 20 is a fragmentary section of a fifteenth embodiment of the present invention interconnecting with a PGA device.

FIG. 20 illustrates the embodiment of FIG. 2 having a Pin Grid Array (PGA) semiconductor package 48A. The PGA semiconductor package 48A has at least one pin contact element 50A. In a preferred mode of the present invention, the top end of the first contact element 32 is cup shaped when used in conjunction with a PGA semiconductor package 48A.

Figure 21:
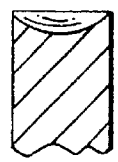
FIG. 21 is a fragmentary detail section view showing a first alternative form of a contact tip.
Figure 22:
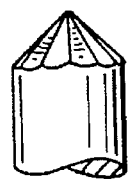
FIG. 22 is a fragmentary detail section view showing a second alternative form of a contact tip.
Figure 23:
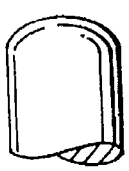
FIG. 23 is a fragmentary detail section view showing a third alternative form of a contact tip.
Figure 24:
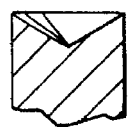
FIG. 24 is a fragmentary detail section view showing a fourth alternative form of a contact tip.
Figure 25:
FIG. 25 is a fragmentary detail section view showing a fifth alternative form of a contact tip.

FIGS. 21–25 represent other embodiments of the top end of the first contact element 32. FIG. 21 shows a cupped shaped top end of the first contact element 32 for engaging a lead of a semiconductor package. FIG. 22 shows a pointed shaped top end of the first contact element 32 for engaging a lead of a semiconductor package. FIG. 23 shows a domed shaped top end of the first contact element 32 for engaging a lead of a semiconductor package. FIG. 24 shows a bevelled interior shaped top end of the first contact element 32 for engaging a lead of a semiconductor package. FIG. 25 shows a angled top end of the first contact element 32 for engaging a lead of a semiconductor package. Finally, the above embodiment are only exemplary and it is recognized that any other shaped top end of the first contact element 32 is considered to be within the scope of the present invention.

The performance of the present invention is exceptional. The present invention has a contact inductance of less than 2 nano-henries, a lead-to-lead capacitance of less than 1 pico-farad, a contact resistance of less than 10 mili-ohms, and an expected life of greater than 500,000 test cycles. In addition, the present invention has relatively few mechanical manufacturing limitations.

Figure 26:
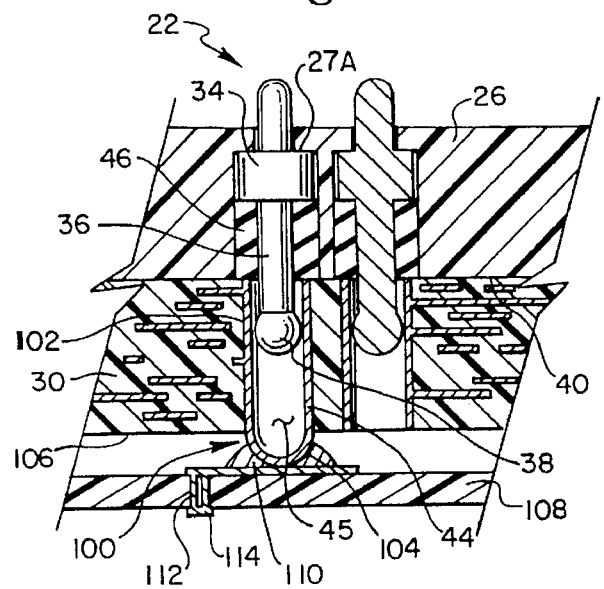
FIG. 26 is an enlarged fragmentary sectional view of the second embodiment of the present invention in conjunction with a contact receptacle.

The embodiment shown in FIG. 26 is similar to the embodiment shown in FIG. 2 except a contact receptacle is used in conjunction therewith. In this embodiment, the second contacting element 36 extends through an elastomer element 46 and may extend a predetermined distance into the passthrough hole in the PC board 30. The passthrough hole in the PC board 30 is called a via 45. The via 45 has an inner surface which may be coated with a conductive coating 44 such that the enlarged sphere 38 at the lower end of the second contacting element 36 may make an electrical connection therewith.

The conductive coating 44 may comprise a contact receptacle 100. The contact receptacle 100 may be a conductive tube having an upper portion 102 and a lower portion 104 wherein the lower portion 104 may be domed shaped and may extend downward beyond a lower surface 106 of PC board 30. The upper portion 102 of the contact receptacle 100 may be received by the via 45 of the PC board 30, and may receive the lower portion of the second contacting element 36. The lower "domed shaped" portion 104 of the contact receptacle 100 may be surface mounted to a DUT board 108, a load board, or any other PC type board by solder reflow or other suitable means. In an illustrative embodiment, the lower "domed shaped" portion 104 may be connected to a trace 112 on DUT board 108 via a solder reflow element 110 wherein the trace 112 may be electrically connected to a via 114. It is recognized that the "dome shape" of the lower portion 104 of the contact receptacle 100 is only exemplary and that other shapes are contemplated.

Figure 27:
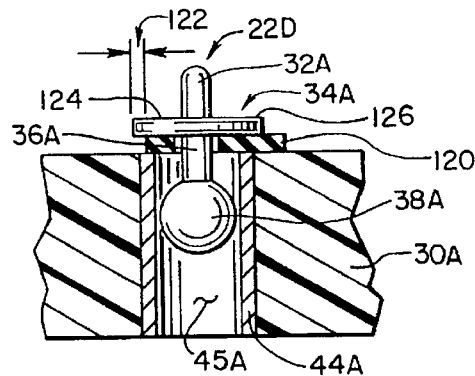
FIG. 27 is an enlarged fragmentary sectional view of yet another embodiment of the present invention employing an offset elastomer element.
Figure 28:
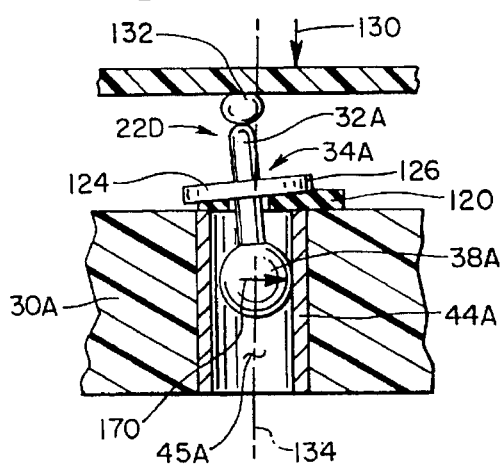
FIG. 28 is an enlarged fragmentary sectional view of the embodiment shown in FIG. 27 having a downward force applied to the contact assembly.

FIG. 27 and FIG. 28 illustrate another embodiment of the present invention wherein a second contact element 36A may only contact one side of an inner surface 44A of via 45A. As stated above, this may allow the enlarged sphere 38A at the lower end of the second contacting element 36A to "scrub" or "wipe" the inner surface 44A of via 45A as the elastomeric element 120 allows the contact assembly 22D to move up and down. This scrubbing action may reduce the potential for high contact or inconsistent contact resistance due to possible contamination on the contacting surfaces, thus providing a longer lasting electrical interconnection.

A number of embodiments are contemplated for providing the necessary bias to the contact to help ensure that the second contact element only contacts one side of the inner surface of the via. In a first embodiment, as shown in FIGS. 27–28, an offset 122 may be provided between elastomeric element 120 and a shoulder 34A of a corresponding contact assembly 22D.

The elastomeric element 120 may be offset in one direction only, radially from a point on the housing, or randomly. The offset 122 may allow a first side 126 of the shoulder 34A to engage more elastomeric material than a second side 124 of the shoulder 34A. Referring to FIG. 28, a force 130 applied to the first contact element 32A by a semiconductor package lead 132 or the like may be transmitted to the shoulder 34A, wherein the second side 124 of the shoulder 34A may be depressed further than the first side 126 of the shoulder because it may engage more elastomeric material 120. This may cause the shoulder 34A, and thus the generally rigid contact 22D, to tilt relative to an axis 134 which is generally coaxial with via 45A in PC board 30A. This in turn, may cause the enlarged sphere 38A of the second contact element 36A to engage only one side 44A of the via 45A. In a preferred embodiment, the elastomeric element 120 may be dimensioned to be substantially the same size as the shoulder 34A, but offset therefrom.

Figure 30:
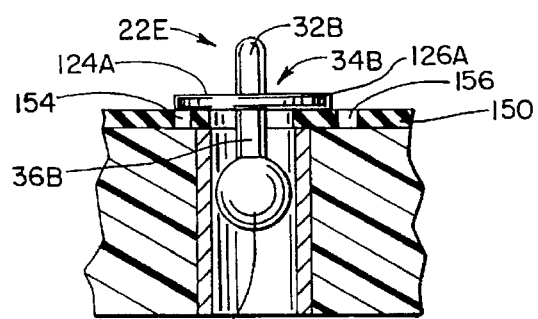
FIG. 30 is an enlarged fragmentary sectional view of the embodiment shown in FIG. 28 as viewed along lines 30—30, and further showing a contact element placed therein.

Referring to FIG. 30, a sheet of elastomer 150 may be provided between the housing and the PC board as described with reference to FIGS. 2–4. Portions of the elastomeric sheet 150 may be selectively removed to reduce the amount of elastomeric material a second side 124 of the shoulder 34A may engage relative to a first side 126 of the shoulder 34A. That is, a portion of the elastomeric material 150 which would normally engage a second side 124 of the shoulder 34A, may be selectively removed. In this configuration, force applied to the contact 22D may cause the shoulder 34A, and thus the contact 22D, to tilt relative to an axis that is generally coaxial with the PC board via, thereby causing the enlarged sphere 38A of the second contact element 36A to engage only one side of the via.

Figure 29:
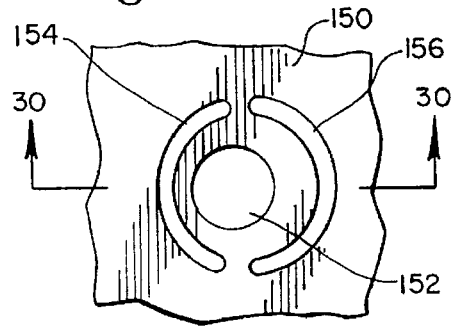
FIG. 29 is an enlarged fragmentary top view of an elastomer sheet having predetermined portions selectively removed therefrom.

By selectively removing predetermined portions of the elastomeric material 150, as described above, the compression characteristics of the elastomeric material 150, as experienced by shoulder 34A of contact 22D, may be altered and controlled. In a first illustrative embodiment, as shown in FIGS. 29–30, a sheet of elastomeric material 150 may have a hole 152 provided therein for receiving a second contacting element 36B of a corresponding contact assembly 22E. A first semi-circular portion 154 and a second semi-circular portion 156 may be selectively removed from elastomeric material 150. The first semi-circular portion 154 and the second semi-circular portion 156 may be generally positioned around the circumference of an imaginary circle having a center point and a radius. The center point of the imaginary circle may be "offset" from hole 152. The radius of the imaginary circle may be such that the first side 126A of the shoulder 34B of the corresponding contact assembly 22E engages more elastomeric material than a second side 124A of the shoulder 34B, as shown in FIG. 30. It is recognized that other shapes may be selectively removed from elastomer sheet 150 and still be within the scope of the present invention.

Figure 31:
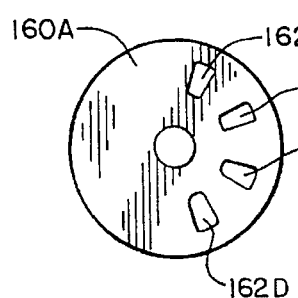
FIG. 31 is a first enlarged top view of an elastomer element having predetermined portions selectively removed therefrom.
Figure 32:
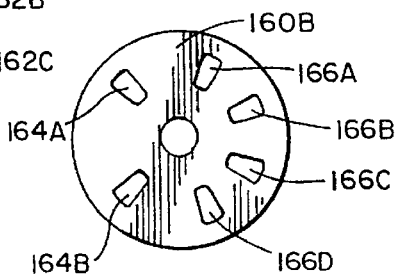
FIG. 32 is a second enlarged top view of an elastomer element having predetermined portions selectively removed therefrom.
Figure 33:
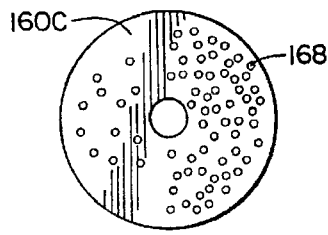
FIG. 33 is a third enlarged top view of an elastomer element having predetermined portions selectively removed therefrom.

FIGS. 31–33 illustrate several other embodiments wherein various portions of an elastomeric element may be selectively removed to control the compression characteristics of the elastomeric material, thereby causing the enlarged sphere 38A of the second contact element 36A to contact only one side of a corresponding via in the PC board. In FIG. 31, a number of spaced elongated shapes 162A, 162B, 162C, and 162D may be removed from a predetermined area of the elastomeric element 160A wherein the predetermined area of the elastomeric element may correspond to the second side 124 of the shoulder.

In another embodiment, a number of spaced elongated shapes 166A, 166B, 166C, and 166D may be removed from a first predetermined area of the elastomeric element 160B wherein the first predetermined area of the elastomeric element 160B may correspond to the second side 124 of the shoulder 34A, and a lesser number of spaced elongated shapes 164A and 164B may be removed from a second predetermined area of the elastomeric element 160B wherein the second predetermined area of the elastomeric element 160B may correspond to the first side 126 of the shoulder 34A.

In yet another embodiment, the number of spaced elongated shapes may comprise a number of holes 168 wherein more holes may be provided in a predetermined portion of the elastomeric material 160C which corresponds to the second side 124 of the shoulder 34A. It is contemplated that the above referenced selectively removed portions may be removed from either a sheet of elastomer or an elastomer element, as described above.

It is recognized that the size, number, shape, and placement of the selectively removed portions 162A, 162B, 162C, 162D, 164A, 164B, 166A, 166B, 166C, 166D, and 168 may affect the compression characteristics of the corresponding elastomeric element, and thus the biasing force of enlarged sphere 38A of the second contact element 36A against a side 44A of the via. Referring back to FIG. 28, for a given force 130 applied along a Y-axis to the first contact element 32A by a semiconductor lead 132 or the like, the compression characteristics of the elastomeric element 120 may be controlled to provide a controlled contact force 170 along an X-axis between the enlarged sphere 38A of second contact element 36A and a side of the via 44A.

For the above referenced embodiments, an increase in the force 130 applied along the Y-axis by semiconductor lead 132 may result in a corresponding increase in the contact force 170 along the X-axis between the enlarged sphere 38A of second contact element 36A and a side 44A of the via. It may be desirable to limit the amount of force 170 that may be applied along the X-axis by the enlarged sphere 38A of second contact element 36A to the side 44A of the via. In a preferred embodiment, the inner surface 44A of the via may comprise aluminum or some other conductive material, and the thickness of the conductive material may be relatively thin. If too much force 170 is applied along the X-axis between the enlarged sphere 38A of second contact element 36A and the inner surface 44A of the via, the conductive material may become scratched or otherwise damaged. This may cause corrosion or even removal of the conductive material therefrom, thereby reducing the reliability of the contacting system.

Figure 34:
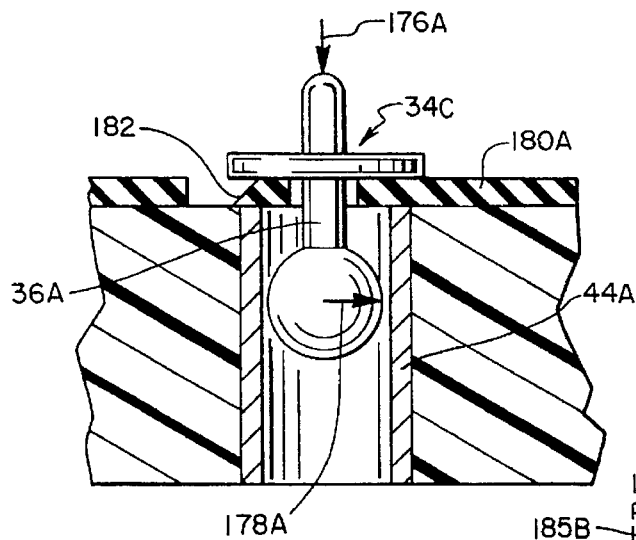
FIG. 34 is an enlarged fragmentary section view of an elastomer element having a beveled edge.
Figure 35:
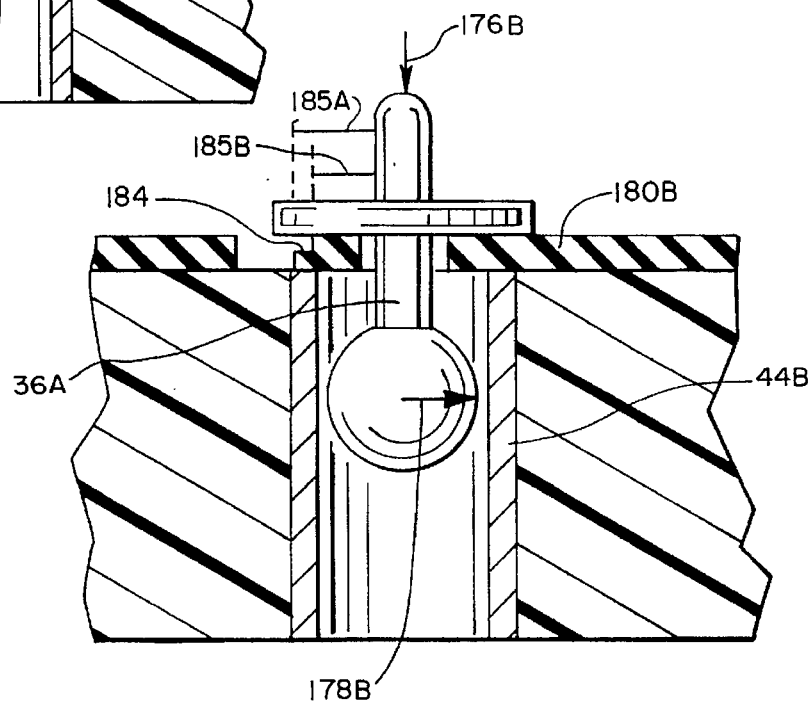
FIG. 35 is an enlarged fragmentary section view of an elastomer element having a stepped edge.
Figure 36:
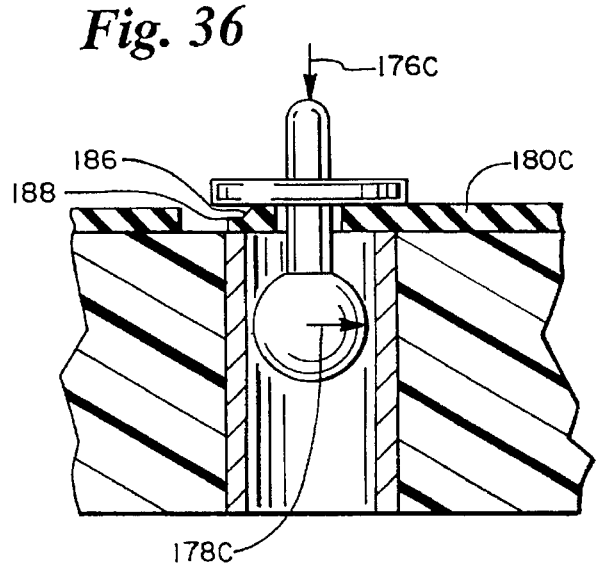
FIG. 36 is an enlarged fragmentary section view of an elastomer element having a beveled and stepped edge.

To overcome this limitation, it may be advantageous to further control the contact force 170 between the enlarged sphere 38A of second contact element 36A and the side 44A of the via. Referring to FIGS. 34–36, in an illustrative embodiment, predetermined ones of the selectively removed portions discussed above may have a bevelled and/or stepped edge provided therein. That is, when the selectively removed portions are cut away or otherwise formed in the elastomeric material, a beveled and/or stepped edge may be provided therein. Although the preferred embodiment provides a beveled and/or stepped edge in the selectively removed portions, it is contemplated that a beveled and/or stepped edge may also be provided on an outer edge of the individual elastomer elements discussed above.

Referring to FIG. 34, when a bevelled edge 182 is provided, the compressibility of the elastomeric element 180A may vary depending on the force 176A applied by a semiconductor lead 132 along the Y-axis. That is, the contact force 178A which may result along the X-axis between the enlarged sphere 38A of second contact element 36A and a side 44A of the via may depend on the magnitude of the force 176A applied along the Y-axis to the first contact element 32A. For example, for a relatively small force 176A applied along the Y-axis by a semiconductor lead 132 or the like, the enlarged sphere 38A of second contact element 36A may deflect a relatively large amount along the X-axis thereby engaging a side 44A of the via. However, as the force 176A applied along the Y-axis increases, the resulting force 178A between the enlarged sphere 38A of second contact element 36A and a side 44A of the via may not increase by a same amount. By properly designing the bevel 182, the force 178A applied along the X-axis between the enlarged sphere 38A of second contact element 36A and a side 44A of the via may be substantially limited, regardless of the force 176A which is applied by a semiconductor lead 132 along the Y-axis.

Referring to FIG. 35, when a stepped edge 184 is provided, the compressibility of the elastomeric element 180B may also vary depending on the force 176B applied by a semiconductor lead 132 along the Y-axis. In this embodiment, the contact force 178B which may result along the X-axis between the enlarged sphere 38A of second contact element 36A and a side 44A of the via may depend on whether the magnitude of the force 176B applied along the Y-axis to the first contact element 32A is above or below a "threshold" level. That is, if the force 176B applied by the semiconductor lead 32A along the Y-axis is below the threshold level, the resulting force 178B along the X-axis between the enlarged sphere 38A of second contact element 36A and a side 44A of the via may be governed by a first width 185A of the elastomeric material 180B which may engage the shoulder. However, if the force 176B applied by the semiconductor lead 132 along the Y-axis is above the threshold level, the resulting force 178B along the X-axis between the enlarged sphere 38A of second contact element 36A and a side 44A of the via may be governed by a second width 185B of the elastomeric material which may engage the shoulder. By properly designing the stepped edge 184, the force 178B applied along the X-axis between the enlarged sphere 38A of second contact element 36A and a side 44A of the via may be substantially limited, regardless of the force 176B which is applied by the semiconductor lead 132 along the Y-axis. It is contemplated that both a beveled edge 186 and a stepped edge 188 may be provided to yield a hybrid between the above two embodiments, as shown in FIG. 36.

It can readily be seen that the bevelled and/or stepped edges may allow an increasing force on the first contact element to result in an increasing force by the enlarged sphere of second contact element on a side of the via or contact receptacle. However, as a desired maximum force between the enlarged sphere of second contact element and a side of the via or contact receptacle is reached, the bevelled and/or stepped edge may reduce or substantially limit the increase in force provided by the enlarged sphere of second contact element to a side of the via or contact receptacle. This may provide control over the contact force between the enlarged sphere of second contact element and the via thereby resulting in a longer lasting and more reliable electrical contacting system.

Figure 37:
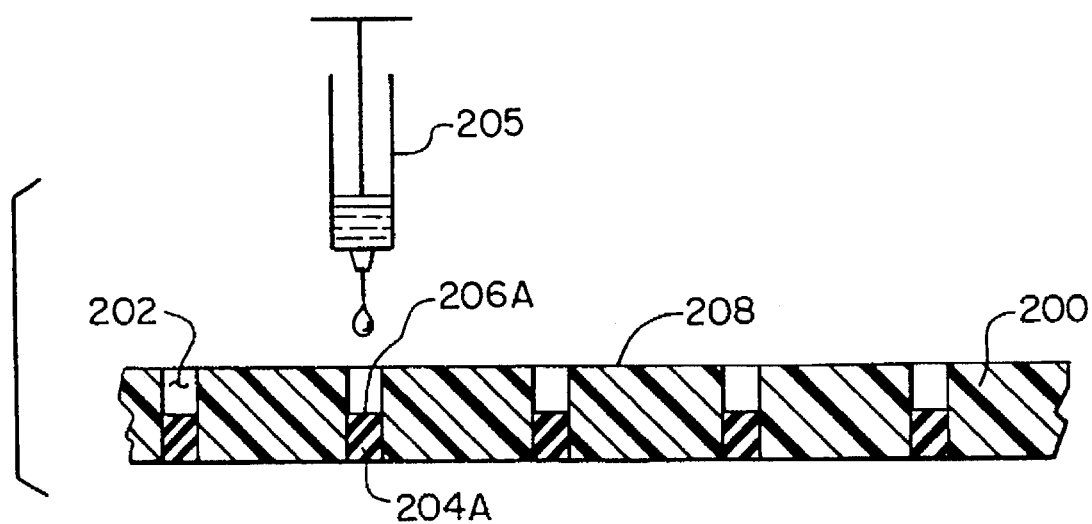
FIG. 37 is an enlarged fragmentary sectional view of yet another embodiment of the present invention wherein a liquid elastomer is used to create the elastomer elements.
Figure 38:
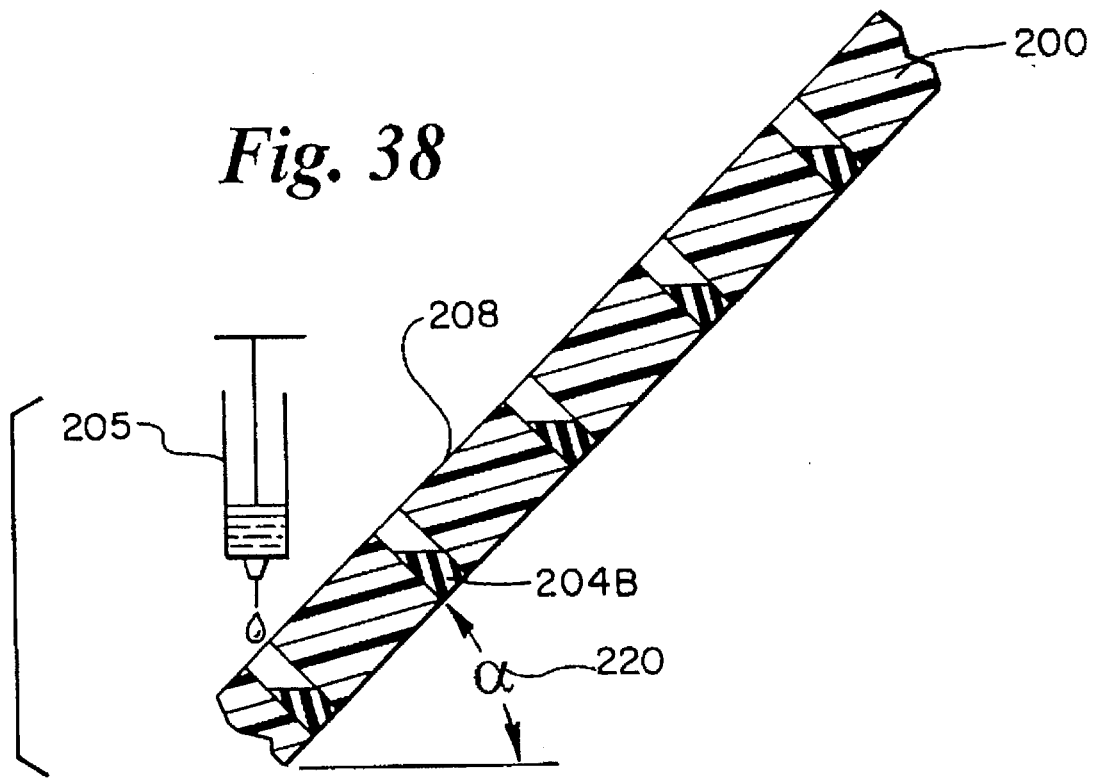
FIG. 38 is an enlarged fragmentary sectional view of a similar embodiment to FIG. 37, but the liquid elastomer is cured at an angle.

Referring to FIGS. 37–39, yet other embodiments of the present invention may comprise a housing 200 having a number of counter bore holes 202 therein. Each of the number of counter bore holes 202 may be substantially perpendicular to the top surface 208 of the housing 200 and may be filled with a liquid elastomer 204A by a dispenser 205.

Referring specifically to FIG. 37, the housing may be placed on a level surface such that top surface 206A of the liquid elastomer 204A may be substantially parallel with the top surface 208 of the housing 200. After the liquid elastomer 204A has cured, a hole may be created therein such that the hole may receive a contact element (not shown). As stated above, it is also contemplated that a contact element may be placed in a corresponding counter bore hole prior to the filling of the counter bore hole with the liquid elastomer. In this embodiment, the liquid elastomer may form around the contact element thereby providing a self aligned contact hole. The contact element may have a shoulder wherein the dimensions of the shoulder may be larger than the hole in the elastomeric material such that the shoulder may engage the elastomeric material 204A.

Referring to FIG. 38 and FIG. 39, the housing 200 of the previous embodiment may be placed at a predetermined angle 220 before the liquid elastomer 204B is allowed to cure. The housing is maintained at the predetermined angle 220 until the liquid elastomer 204B has cured, as shown in FIG. 38. Thereafter, a hole 222 may be created in the elastomeric elements wherein the hole 222 may receive a contact element 22F. As stated above, it is also contemplated that a contact element may be placed in a corresponding counter bore hole prior to the filling of the counter bore hole with the liquid elastomer, resulting in a self aligned contact hole. In this configuration, a top surface 206B of the elastomeric elements may be at the predetermined angle 220 relative to a corresponding counterbore hole 202A. The contact element 22F may be substantially aligned with the counter bore hole 202B.

As a force 250 is applied to a contact element 22G, the shoulder 36D may engage the top surface 206C of a corresponding elastomeric element 204C. As the force 250 increases, the shoulder 36D, and thus the contact element 22G, may be urged to conform to the predetermined angle 220, thereby providing a force in the X-direction between a corresponding enlarged sphere 38D of the second contact element and a side 44D of a via, as described above.

Finally, it is recognized that the present invention may be used with a Pin Grid Array (PGA) package, a Ball Grid Array (BGA) package, a DIP package, or any other type of semiconductor package or circuit-board to circuit interconnection means. In addition, it is recognized that the present invention does not require a PC board. Rather, any means for connecting the pin assembly to a tester apparatus is considered to be within the scope of the present invention.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for electrically interconnecting a first terminal to a second terminal wherein the first terminal is spaced a distance from the second terminal, comprising:

(a) a conductive element having an upper end and a lower end, the conductive element comprising a first contact located at the upper end and a second contact located at the lower end, the first contact being electrically connected to the first terminal; and (b) means, comprising an elastomeric material, mounting the conductive element, for resiliently biasing the conductive element to an original position, the resilient biasing means being overcome when a force is applied to the conductive element, thereby allowing the conductive element to move in a direction against the bias of the biasing means in response to the force, the resilient biasing means further causing the conductive element to tilt away from an axis that is generally coaxial with the original position of the conductive element such that the second contact is biased against the second terminal, the resilient biasing means returning the conductive element to substantially the original position when the force is removed.

2. Apparatus according to claim 1 wherein the resilient biasing means comprises an elastomer sheet.

3. Apparatus according to claim 2 wherein the elastomer sheet has at least one predetermined portion removed therefrom, the at least one predetermined portion being removed from a position such that the force applied to the conductive element overcomes the elastomer sheet on a first side of the conductive element more easily than the force overcomes the elastomer sheet on a second side of the conductive element, thereby causing the conductive element to tilt away from an axis that is generally coaxial with the original position of the conductive element.

4. Apparatus according to claim 3 wherein the elastomer sheet has at least one edge corresponding to the removal of the at least one predetermined portion, the at least one edge comprising a bevel.

5. Apparatus according to claim 3 wherein the elastomer sheet has at least one edge corresponding to the removal of the at least one predetermined portion, the at least one edge comprising a step.

6. Apparatus according to claim 3 wherein the elastomer sheet has at least one edge corresponding to the removal of the at least one predetermined portion, the at least one edge comprising a bevel and a step.

7. Apparatus according to claim 3 comprising a plurality of conductive elements wherein the elastomer sheet mounts the plurality of conductive elements, the elastomer sheet having at least one predetermined portion removed therefrom, the at least one predetermined portion being removed from a position such that the force applied to at least one of the plurality of conductive elements overcomes the elastomer sheet on a first side of the corresponding at least one of the plurality of conductive elements more easily than the force overcomes the elastomer sheet on a second side of the corresponding at least one of the plurality of conductive elements.

8. Apparatus according to claim 1 wherein the resilient biasing means comprises an elastomer element carrying the conductive element.

9. Apparatus according to claim 8 wherein the elastomer element is offset from the conductive element.

10. Apparatus according to claim 8 wherein the elastomer element has at least one predetermined portion removed therefrom, the at least one predetermined portion being positioned such that the force applied to the conductive element overcomes the elastomer element on a first side of the conductive element more easily than the force overcomes the elastomer element on a second side of the conductive element, thereby causing the conductive element to tilt away from an axis that is generally coaxial with the original position of the conductive element.

11. Apparatus according to claim 8 wherein the elastomer element has at least one edge, the at least one edge comprising a bevel.

12. Apparatus according to claim 8 wherein the elastomer element has at least one edge, the at least one edge comprising a step.

13. Apparatus according to claim 8 wherein the elastomer element has at least one edge, the at least one edge comprising a bevel and a step.

14. Apparatus according to claim 8 wherein there are a plurality of conductive elements and a corresponding plurality of elastomer elements, each of the plurality of elastomer elements biasing a corresponding one of the plurality of conductive elements.

15. Apparatus according to claim 14 wherein each of the plurality of elastomer elements are offset from the corresponding one of the plurality of conductive elements.

16. Apparatus according to claim 14 wherein at least one of the plurality of corresponding elastomer elements has at least one predetermined portion removed therefrom, the at least one predetermined portion being removed from a position such that the force applied to the corresponding conductive elements overcomes the corresponding elastomer element on a first side of the corresponding conductive element more easily than the force overcomes the corresponding elastomer element on a second side of the corresponding conductive element.

17. Apparatus for electrically interconnecting a lead of a device to a terminal spaced a distance from the lead, comprising:
(a) a conductive element comprising a first contact, a shoulder, and a second contact, the first contact being attached to the shoulder and extending upward therefrom, and the second contact being attached to the shoulder and extending downward therefrom, the first contact being electrically connected to the lead of the device when the lead of the device is brought into engagement with the first contact and the second contact being electrically connected to the terminal when the lead of the device is brought into engagement with the first contact;
(b) a support member positioned below the shoulder of the conductive element; and
(c) resilient biasing means comprising an elastomeric material positioned between the shoulder of the conductive element and the support member for resiliently biasing the conductive element in an original position, the resilient biasing means being overcome when a force is applied to the conductive element thereby allowing the conductive element to move in a downward direction in response to the force, the resilient biasing means further causing the conductive element to tilt away from an axis that is generally coaxial with the original position of the conductive element such that the second contact is biased against engages the terminal, the resilient biasing means returning the conductive element to substantially the original position when the force is removed.

18. Apparatus according to claim 17 wherein the shoulder of the conductive element has a first side and a second side, the first side and the second side of the shoulder being resiliently biased such that the force applied to the conductive element overcomes the resilient biasing means on a first side of the shoulder more easily than the force overcomes the resilient biasing means on a second side of the shoulder.

19. Apparatus according to claim 18 wherein the resilient biasing means comprises an elastomeric sheet being positioned between the shoulder of the conductive element and the support member.

20. Apparatus according to claim 19 wherein the first side of the shoulder engages more of the elastomeric sheet than the second side of the shoulder.

21. Apparatus according to claim 20 wherein the elastomer sheet has at least one predetermined portion that is selectively removed therefrom, the at least one predetermined portion being positioned such that the force applied to the conductive element overcomes the elastomer sheet on the first side of the shoulder more easily than the force overcomes the elastomer sheet on the second side of the shoulder.

22. Apparatus according to claim 21 wherein the first side of the shoulder has a corresponding number of predetermined portions that would otherwise be positioned thereunder and the second side of the shoulder has a corresponding number of predetermined portions that would otherwise be positioned thereunder, the number of predetermined portions corresponding to the first side of the shoulder being less than the number of predetermined portions corresponding to the second side of the shoulder.

23. Apparatus according to claim 21 wherein the at least one predetermined portion comprises a semi-circular groove portion.

24. Apparatus according to claim 21 wherein the at least one predetermined portion comprises an elongated shape.

25. Apparatus according to claim 21 wherein the at least one predetermined portion comprises a one hole.

26. Apparatus according to claim 21 wherein the elastomer sheet has at least one edge corresponding to the removal of the at least one predetermined portion, the at least one edge comprising a bevel.

27. Apparatus according to claim 21 wherein the elastomer sheet has at least one edge corresponding to the removal of the at least one predetermined portion, the at least one edge comprising a step.

28. Apparatus according to claim 21 wherein the elastomer sheet has at least one edge corresponding to the removal of the at least one predetermined portion, the at least one edge comprising a bevel and a step.

29. Apparatus according to claim 18 wherein the resilient biasing means comprises an elastomeric element being positioned between the shoulder of the conductive element and the support member.

30. Apparatus according to claim 29 wherein the elastomer element is offset from the shoulder of the conductive element.

31. Apparatus according to claim 29 wherein the elastomer element has at least one predetermined portion removed therefrom, the at least one predetermined portion being positioned such that the force applied to the conductive element overcomes the elastomer element on the first side of the shoulder more easily than the force overcomes the elastomer element on the second side of the shoulder, thereby causing the conductive element to tilt away from an axis that is generally coaxial with the original position of the conductive element.

32. Apparatus according to claim 31 wherein the elastomer element has at least one edge, the at least one edge comprising a bevel.

33. Apparatus according to claim 31 wherein the elastomer element has at least one edge, the at least one edge comprising a step.

34. Apparatus according to claim 31 wherein the elastomer element has at least one edge, the at least one edge comprising a bevel and a step.

35. Apparatus according to claim 31 wherein there are a plurality of conductive elements and a corresponding plurality of elastomer elements, each of the plurality of elastomer elements being positioned between the shoulder of a corresponding one of the plurality of conductive elements and the support member.

36. Apparatus according to claim 35 wherein each of the plurality of elastomer elements are offset from the corresponding one of the plurality of conductive elements.

37. Apparatus according to claim 35 wherein at least one of the plurality of corresponding elastomer elements have at least one predetermined portion removed therefrom, the at least one predetermined portion being removed from a position such that the force applied to a corresponding conductive element overcomes the corresponding elastomer element on the first side of the shoulder of the corresponding conductive element more easily than the force overcomes the corresponding elastomer element on the second side of the shoulder of the corresponding conductive element.

38. Apparatus for electrically interconnecting a lead of a device to a terminal spaced a distance from the lead, comprising:

(a) a pin assembly comprising a first contact, a shoulder, and a second contact, the first contact being attached to the shoulder and extending upward therefrom, and the second contact being attached to the shoulder and extending downward therefrom, the first contact being electrically coupled to the lead of the device when the lead of the device is brought into engagement with the first contact and the second contact being electrically coupled to the terminal;

(b) a housing having an upper surface and a lower surface, the housing further having a first opening extending therethrough for receiving the first contact of the pin assembly and further having a counterbore extending from the lower surface of the housing for a predetermined depth for receiving the shoulder of the pin assembly;

(c) an elastomer sheet having an upper surface and a lower surface, the upper surface of the elastomer sheet extending along the lower surface of the housing and engaging the shoulder of the pin assembly, the elastomer sheet having an opening therethrough for receiving the second contact of the pin assembly and further having at least one predetermined portion selectively removed therefrom, the at least one predetermined portions being removed from a portion of the elastomer sheet that would otherwise engage the shoulder of the pin assembly; and (d) a support member having an upper and lower surface, the upper surface extending along the lower surface of the elastomer sheet, the support member being connected to the housing.

39. Apparatus according to claim 38 wherein there are a plurality of pin assemblies each having a shoulder, the elastomer sheet being positioned between the shoulders of the plurality of pin assemblies and the support member.

40. Apparatus according to claim 39 wherein the support member is a printed circuit board.

41. Apparatus according to claim 40 wherein the printed circuit board has a via therethrough for receiving the second contact of the conductive element.

42. Apparatus according to claim 41 wherein the via of the printed circuit board has an inner surface and the inner surface is coated with a conductive coating.

43. Apparatus according to claim 42 wherein the second contact engages a side of the inner surface of the via when a downward force is applied to the first contact.

44. Apparatus according to claim 40 wherein the printed circuit board has a contact receptacle comprising an opening with a depth for receiving the second contact.

45. Apparatus according to claim 44 wherein the opening has an inner surface and the inner surface is coated with a conductive coating.

46. Apparatus according to claim 45 wherein the second contact engages a side of the inner surface of the contact receptacle when a downward force is applied to the first contact.

47. Apparatus according to claim 46 wherein the contact receptacle has an upper portion and a lower portion, the lower portion extending below the lower surface of the support member and being electrically connected to a terminal.

48. Apparatus for electrically interconnecting a lead of a device to a terminal spaced a distance from the lead, comprising:

(a) a pin assembly comprising a first contact, a shoulder, and a second contact, the first contact being attached to the shoulder and extending upward therefrom, and the second contact being attached to the shoulder and extending downward therefrom, the first contact being electrically coupled to the lead of the device when the lead of the device is brought into engagement with the first contact and the second contact being electrically coupled to the terminal;

(b) an elastomer element having an opening therethrough for receiving the second contact of the pin assembly, the elastomer element further providing a bias to the pin assembly such that the pin assembly is urged to tilt away from an axis that is generally coaxial with an original position of the pin assembly in response to a downward force on the first contact;

(c) a housing having an upper surface and a lower surface, the housing further having a first opening extending therethrough for receiving the first contact of the pin assembly and further having a counterbore extending from the lower surface of the housing for a predetermined depth for receiving the shoulder of the pin assembly and the elastomer element; and (d) a support member extending along the lower surface of the housing, the support member being connected to the housing.

49. Apparatus according to claim 48 wherein the elastomer element is offset relative to the pin assembly.

50. Apparatus according to claim 48 wherein the elastomer element has at least one predetermined portion selectively removed therefrom, the at least one predetermined portions being removed from a portion of the elastomer element that would otherwise engage the shoulder of the pin assembly.

51. Apparatus according to claim 48 wherein there are a plurality of conductive elements and a plurality of elastomer elements, each of the plurality of elastomer elements being positioned between the shoulder of a corresponding one of the plurality of conductive elements and the support member.

52. Apparatus according to claim 51 wherein each of the plurality of elastomer elements are offset from a corresponding one of the plurality of pin assemblies in a predetermined direction.

53. Apparatus according to claim 52 wherein the support member is a printed circuit board.

54. Apparatus according to claim 53 wherein the printed circuit board has a via therethrough for receiving the second contact of the conductive element.

55. Apparatus according to claim 54 wherein the via of the printed circuit board has an inner surface and the inner surface is coated with a conductive coating.

56. Apparatus according to claim 55 wherein the second contact only contacts one side of the inner surface of the via when a downward force is applied to the first contact.

57. Apparatus according to claim 48 wherein the elastomer element has a top surface, the top surface being at a predetermined angle relative to the shoulder of the pin assembly when the pin assembly is in the original position.

58. A method for providing an elastomer element having a top surface that is angled relative to a shoulder of a pin assembly, the method comprising the steps of:

(a) providing a housing wherein the housing has a counter bore hole therein;

(b) tilting the housing to a predetermined angle;

(c) filing the counter bore hole with a liquid elastomer to a predetermined level; and (d) allowing the liquid elastomer to cure resulting in an elastomer element.

59. A method according to claim 58 further comprising the steps of:

(e) creating a hole in the elastomer element, the hole being smaller than the size of the shoulder of the pin assembly; and (f) inserting a lower portion of the pin assembly through the hole until the shoulder engages a portion of the elastomer element.

60. A method for providing an elastomer element having a top surface that is angled relative to a shoulder of a pin assembly, the method comprising the steps of:

(a) providing a housing wherein the housing has a counter bore hole therein;

(b) inserting the pin assembly into the counter bore hole;

(c) tilting the housing and the pin assembly to a predetermined angle;

(d) filling the counter bore hole with a liquid elastomer to a predetermined level; and (e) allowing the liquid elastomer to cure.

* * * * *